(12) United States Patent
Bertin et al.

(10) Patent No.: US 6,319,745 B1
(45) Date of Patent: Nov. 20, 2001

(54) FORMATION OF CHARGE-COUPLED-DEVICE WITH IMAGE PICK-UP ARRAY

(75) Inventors: Claude L. Bertin, South Burlington; William R. Tonti; Jerzy M. Zalesinski, both of Essex Junction, all of VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/584,315

(22) Filed: May 31, 2000

(51) Int. Cl.[7] .......................... H01L 21/00; H01L 21/44; H01L 21/48; H01L 21/50
(52) U.S. Cl. .......................... 438/60; 438/118; 438/119; 438/113
(58) Field of Search .................................. 438/60, 74, 75, 438/57, 68, 113, 116, 118, 119, 107, 108, 455–459

(56) References Cited

U.S. PATENT DOCUMENTS

| | | |
|---|---|---|
| 4,467,342 | 8/1984 | Tower . |
| 4,622,574 | 11/1986 | Garcia . |
| 4,946,716 * | 8/1990 | Corrie .................................. 427/289 |
| 5,146,308 | 9/1992 | Chance et al. . |
| 5,478,781 | 12/1995 | Bertin et al. . |
| 5,571,754 | 11/1996 | Bertin et al. . |
| 5,606,198 | 2/1997 | Ono et al. . |
| 5,731,222 | 3/1998 | Malloy et al. . |
| 5,786,236 * | 7/1998 | Thompson et al. ..................... 438/60 |
| 6,093,577 * | 7/2000 | van der Groen et al. ............. 438/30 |
| 6,169,319 * | 1/2001 | Malovitch et al. ................... 257/447 |

* cited by examiner

*Primary Examiner*—Chandra Chaudhari
*Assistant Examiner*—Erik Kielin
(74) *Attorney, Agent, or Firm*—Howard J. Walter, Jr.

(57) ABSTRACT

A method and structure for manufacturing Charge-Coupled-Device (CCD) image pick-up devices. The method bonds a first wafer with a second wafer. The first wafer has a CCD layer on a first substrate, wherein the CCD layer includes a plurality of CCD pick-up image arrays. The CCD layer is thin, preferably in a range of 5 to 20 microns, while the substrate is relatively thicker (e.g., 300 microns). The first wafer also includes first conductive pads arranged in a pattern on a surface of the CCD layer such that each CCD array is conductively coupled to a plurality of the first conductive pads. The second wafer has a second substrate that includes a semiconductor material such as silicon, and second conductive pads according to the pattern on a surface of the second substrate. The first wafer is bonded with the second wafer to form a wafer composite, wherein the first conductive pads are joined to the second conductive pads in accordance with the pattern. Then, the first substrate is removed and the second wafer provides mechanical support for the CCD layer during the removal process, followed by dicing the wafer composite into a plurality of image pick-up devices such that each image pick-up device includes a CCD array of the CCD layer. The image pick-up devices may be used for photoimageing of objects.

20 Claims, 7 Drawing Sheets

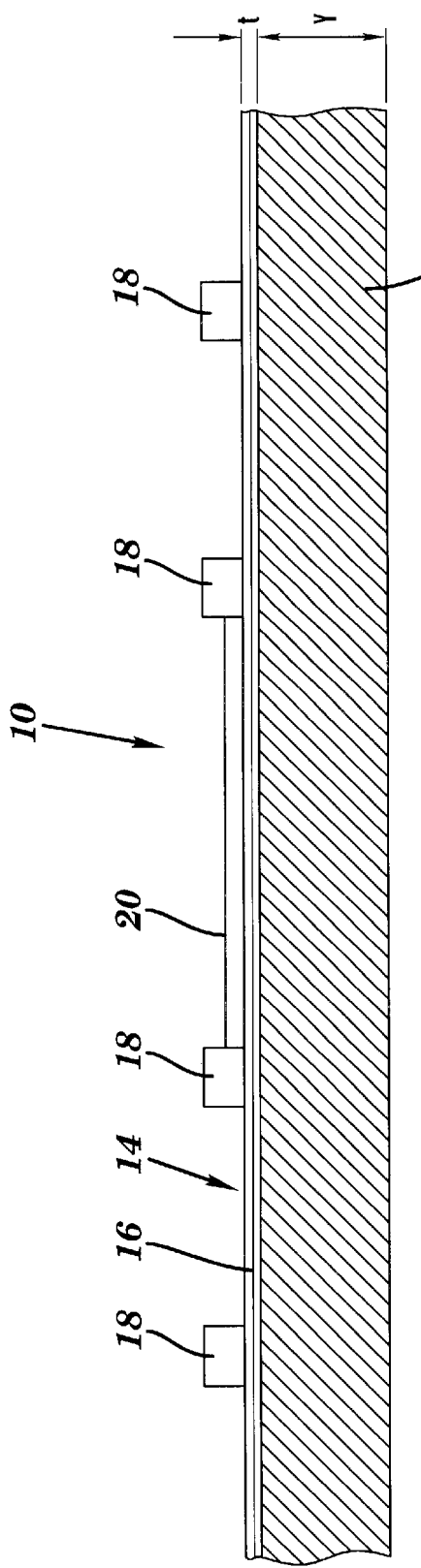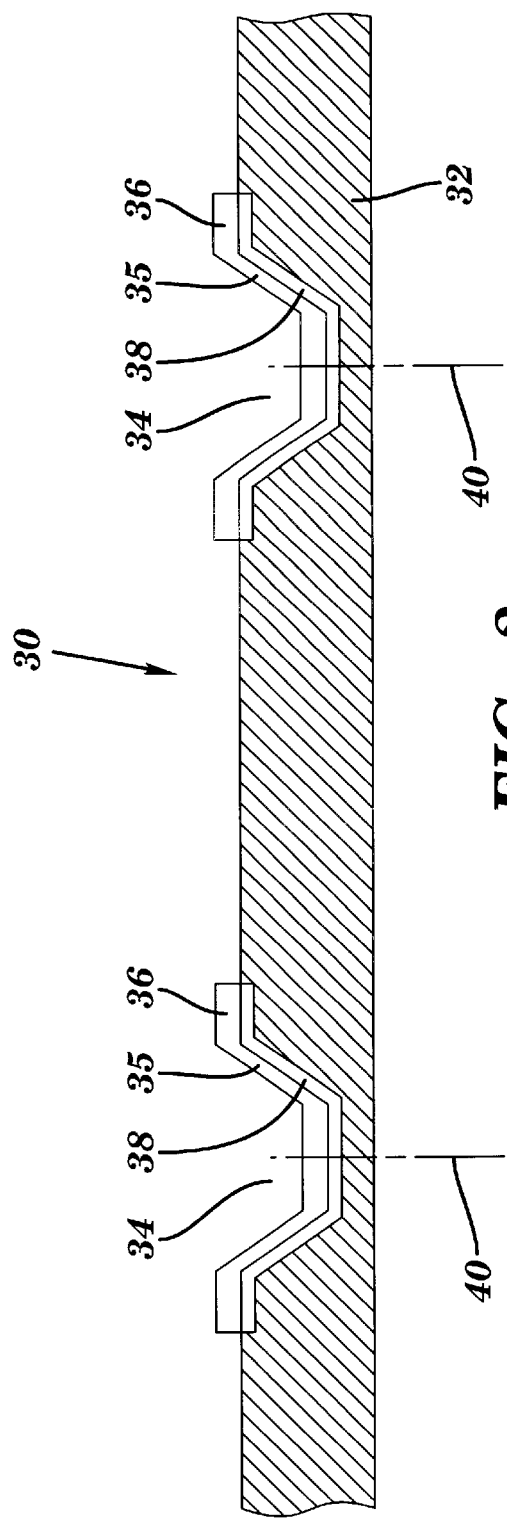

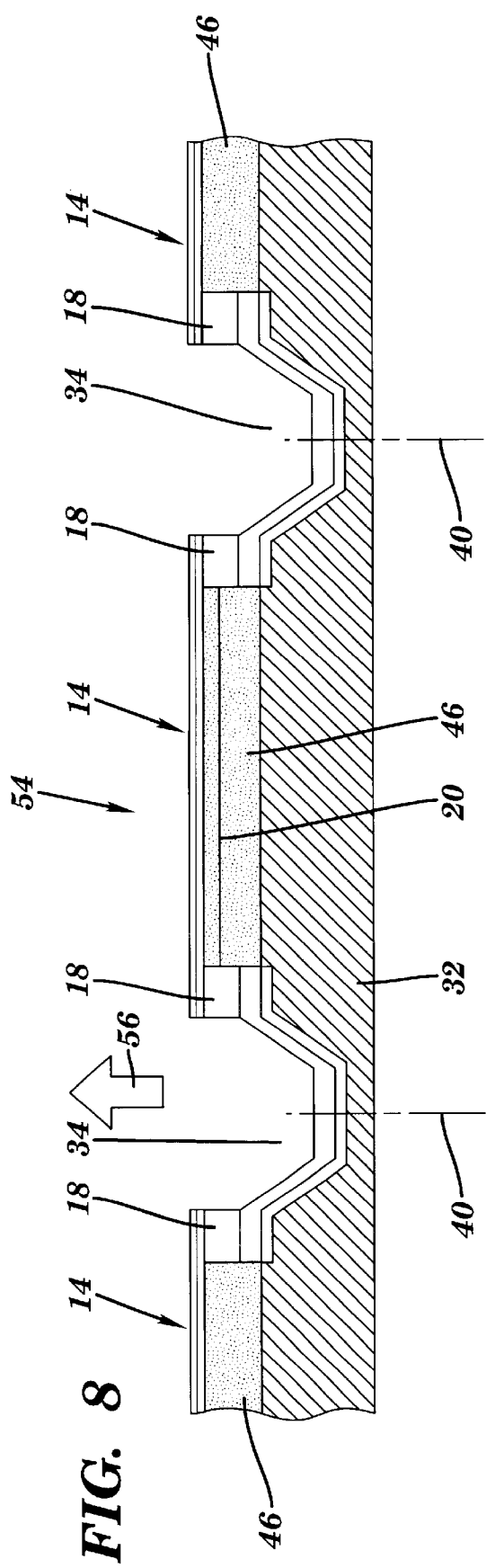

FORMATION OF CHARGE-COUPLED-DEVICE WITH IMAGE PICK-UP ARRAY

BACKGROUND OF THE INVENTION

1. Technical Field

The present invention relates to a method and structure for manufacturing Charge-Coupled-Device (CCD) image pick-up devices.

2. Related Art

Charge-Coupled-Device (CCD) image pick-up devices have been manufactured by: forming a wafer having a thin (e.g., 20 micron) CCD layer on a much thicker (e.g., 300 microns) silicon layer, dicing the wafer into individual dies, removing the silicon layer from the die, and bonding the resultant CCD layer to additional structure to form a complete chip. The preceding process is expensive and prone to fabrication failures because of the thinness of the CCD layer coupled with the fact that the CCD layer is unsupported mechanically while the silicon layer is removed from the die. Additionally, removing the CCD layer from each die individually is inherently inefficient.

There is a need for an inexpensive, efficient, and reliable method of manufacturing CCD image pick-up devices.

SUMMARY OF THE INVENTION

The present invention provides a method for forming Charge-Coupled-Device (CCD) image pick-up devices, comprising:

forming a first wafer having a first substrate, a CCD layer on the first substrate, and first conductive pads arranged in a pattern on a surface of the CCD layer, wherein the CCD layer includes a plurality of CCD image pick-up arrays, and wherein each CCD array of the CCD layer is conductively coupled to a plurality of the first conductive pads;

providing a second wafer having a second substrate that includes a semiconductor material, and second conductive pads arranged in the pattern on a surface of the second substrate;

bonding the first wafer with the second wafer to form a wafer composite, wherein the first conductive pads are joined to the second conductive pads in alignment according to the pattern;

removing a portion of a thickness of the first substrate, after the bonding step, wherein the second wafer provides mechanical support for the CCD layer during said removing; and dicing the wafer composite, after the removing step, to form a plurality of the image pick-up devices such that each image pick-up device includes a CCD array of the CCD layer.

The present invention provides a wafer structure, comprising:

a first wafer having a Charge-Coupled-Device (CCD) layer, and first conductive pads arranged in a pattern on a surface of the CCD layer, wherein the CCD layer includes a plurality of CCD image pick-up arrays, and wherein each CCD array of the CCD layer is conductively coupled to a plurality of the first conductive pads; and a second wafer having a semiconductor substrate that includes a semiconductor material, and second conductive pads in the pattern on a surface of the semiconductor substrate, wherein the first conductive pads are joined to the second conductive pads in accordance with the pattern.

The present invention provides a method for forming Charge-Coupled-Device (CCD) image pick-tip devices, comprising:

forming a first wafer having a first substrate, a CCD layer on the first substrate, and first conductive pads arranged in a pattern on a surface of the CCD layer, wherein the CCD layer includes a plurality of CCD image pick-up arrays, and wherein each CCD array of the CCD layer is conductively coupled to a plurality of the first conductive pads;

providing a second wafer having a second substrate that includes a semiconductor material, and second conductive pads arranged in the pattern on a surface of the second substrate;

bonding the first wafer with the second wafer to form a wafer composite, wherein the first conductive pads are joined to the second conductive pads in alignment according to the pattern; and dicing the wafer composite, after the bonding step, to form a plurality of the image pickup devices such that each image pick-up device includes a CCD array of the CCD layer.

The present invention provides an inexpensive, efficient, and reliable method of manufacturing CCD image pick-up devices.

BRIEF DESCRIPTION OF THE DRAWINGS

FIG. 1 depicts a front cross-sectional view of a first wafer having a Charge Coupled Device (CCD) layer on a substrate, in accordance with embodiments of the present invention.

FIG. 2 depicts a front cross-sectional view of a second wafer, in accordance with the embodiments of the present invention.

FIG. 8 depicts FIG. 7 after portions of the CCD layer have been removed.

FIG. 9 depicts an image pick-up device that has resulted from dicing the wafer composite of FIG. 8 into image pick-up devices.

DETAILED DESCRIPTION OF THE INVENTION

Figure 3:
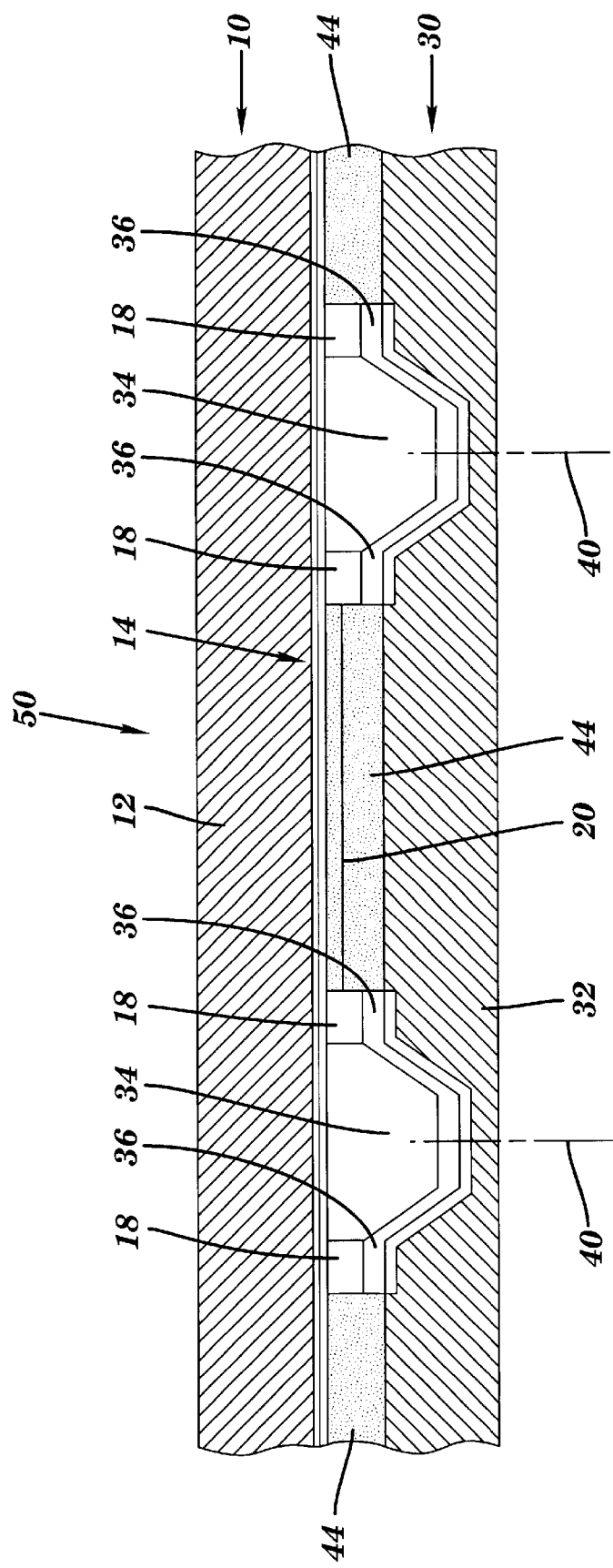
FIG. 3 depicts a wafer composite comprising the first wafer of FIG. 1 bonded by an adhesive layer to the second wafer of FIG. 2.

FIG. 1 illustrates a front cross-sectional view of a first wafer 10 having a Charge Coupled Device (CCD) layer 14 on a substrate 12, in accordance with embodiments of the present invention. The CCD layer 14 includes a semiconductor material (e.g., silicon) and a CCD image pick-up array ("CCD array") 16, which is photosensitive. The CCD array 16, which may be used in conjunction with photoimageing an object, includes an array of locations such that each location is either charged or uncharged in response to exposure of the CCD array16 to electromagnetic radiation. Thus if the electromagnetic radiation is used to photoimage the object, then the collection of charged and uncharged locations of the CCD array 16, in response to the incident electromagnetic radiation, represents a characteristic of the object such as an image or picture of the object or a distribution of density of the object. The thickness (t) of the CCD layer 14 should be at least about 5 microns, and preferably in a range of about 5 to about 20 microns. The substrate 12 should have a thickness (Y) large enough to provide mechanical support for the relatively thinner CCD layer 14 and 300 microns is a representative value of Y if the material used within the CCD layer 14 is silicon. The minimum value for the thickness Y depends on the structural properties of the particular material composition used within the CCD layer 14. The substrate 12 will be later removed, fully or partially, to allow minimally attenuated electromagnetic radiation to reach and interact with the CCD layer 14, wherein such electromagnetic radiation is moving toward the CCD layer 14 in the direction 22. The CCD layer 14 may be formed on the substrate 12 by any method known to one of ordinary skill in the art such as by low temperature epitaxial silicon deposition. The conductive pads 18 are distributed on the CCD layer 14 in a pattern, which may be a predetermined pattern, and will be used to conductively couple the first wafer 10 to a second wafer 30 illustrated FIG. 2. Note that any pair of the conductive pads 18 may be electrically coupled by a conductive circuit pattern 20, which enables the CCD array 16 of the CCD layer 14 to be conductively coupled to electrical devices and electrical structures external to the first wafer 10.

FIG. 2 illustrates a front cross-sectional view of the second wafer 30, in accordance with embodiments of the present invention. The second wafer 30 includes a substrate 32, and conductive pads 36 distributed on the substrate 32 according to the same pattern of distribution of the conductive pads 18 on the CCD layer 14 in FIG. 1. Returning to FIG. 2, the substrate 32 includes any doped or undoped semiconductor material (e.g., silicon) that serves an electronic purpose or function for the second wafer 30. The second wafer 30 may include conductive stricture, such as plated blind vias (i.e., trenches) 34, conductively coupled to the conductive pads 36. Each plated blind via 34 includes a metallic layer 35, conductively coupled to the conductive pad 36, and an insulative layer 38 that electrically insulates the metallic layer 35 and the conductive pad 36 from the substrate 32 and from other conductive structure within, or coupled to, the substrate 32. The metallic layer 35 includes a conductive metal such as, inter alia, copper, aluminum, tungsten, and alloys that include copper, aluminum, or tungsten. The insulative layer 38 includes an insulative material such as, inter alia, an oxide (e.g., silicon dioxide) or a nitride (e.g., silicon nitride). While FIG. 2 shows the plated blind vias 34 conductively coupled to the conductive pads 36, any other type of conductive structures (e.g., a plated through hole, conductive wiring, etc.) within the substrate 32 may be conductively coupled to the conductive pads 36. While FIG. 2 shows the substrate 32 as a single layer, the substrate 32 is generally a multilayered structure having one or more layers, wherein each layer of the multilayered structure may have any internal type of conductive structure, and wherein the layers of the multilayered structure are mechanically and electrically coupled by any techniques known to one of ordinary skill in the art. The cut lines 40 indicate lines along which the second wafer 30 will be cut to generate an image pick-up device 60 shown, and described infra, in FIG. 9.

FIG. 3 illustrates a wafer composite 50 comprising the first wafer 10 of FIG. 1 bonded to the second wafer 30 of FIG. 2, such that the conductive pads 18 of the first wafer 10 are mechanically and conductively joined to the conductive pads 36 of the second wafer 30, in accordance with the pattern of distribution of the conductive pads 18 on the CCD layer 14 in FIG. 1. As a consequence of the bonding of the first wafer 10 to the second wafer 30, the conductive structure 20 between a pair of the conductive pads 18 is interposed between the CCD layer 14 and the wafer 30. The mechanical bonding of the first wafer 10 to the second wafer 30 is accomplished with an adhesive layer 44 that mechanically bonds the CCD layer 14 to the substrate 32. The adhesive layer 44 may include any adhesive material such as an epoxy-based adhesive material. The bonding, with use of the adhesive layer 44, may be implemented in a manner known to one of ordinary skill in the art. For example, the bonding may be implemented by applying uncured epoxy and curing by elevated temperature and/or contact pressure.

Figure 4:
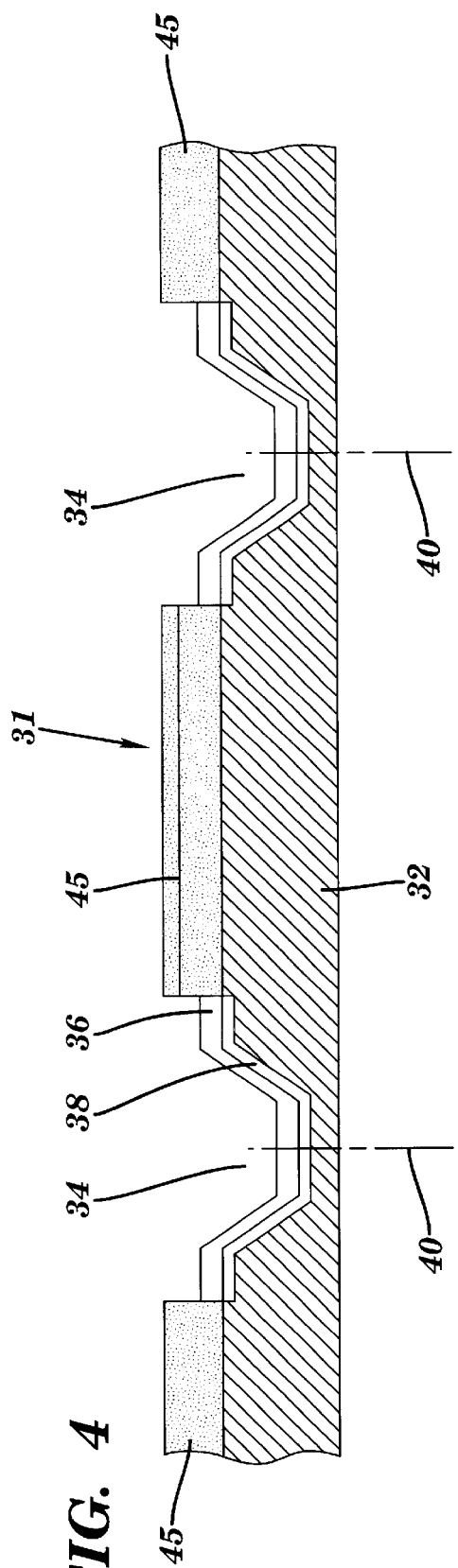
FIG. 4 depicts the second wafer of FIG. 2 with an added oxide layer.
Figure 5:
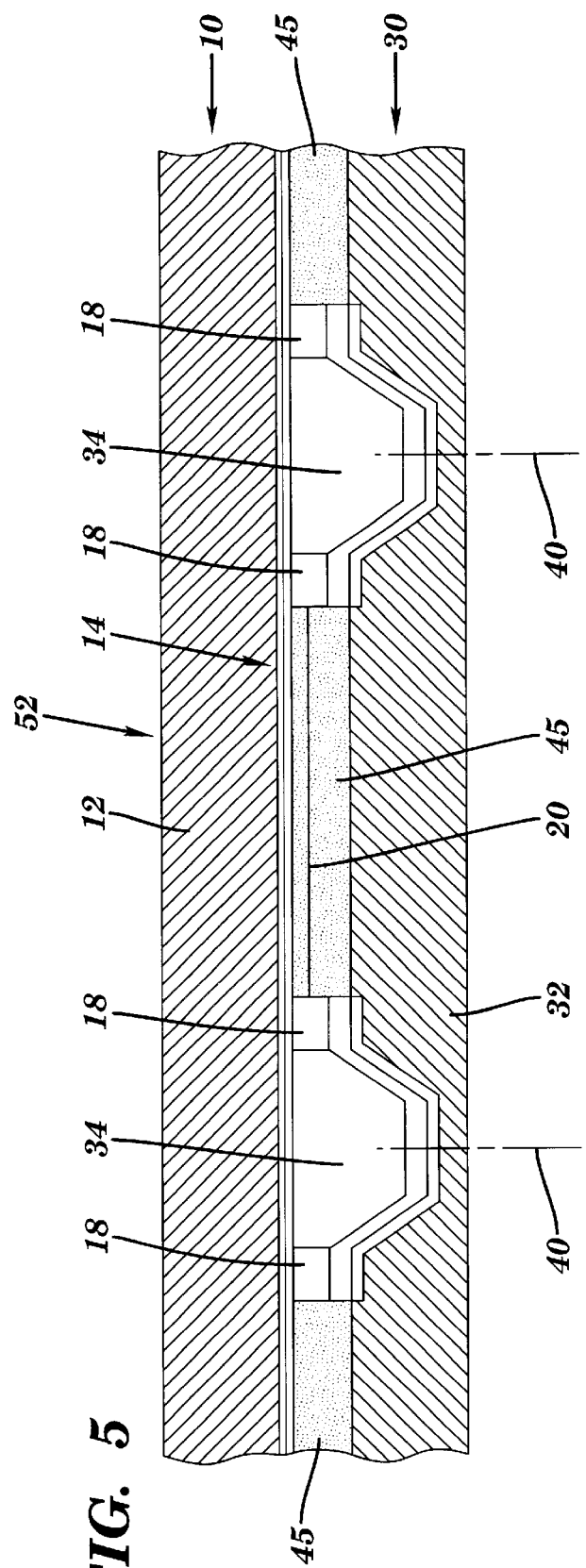
FIG. 5 depicts a wafer composite comprising the first wafer of FIG. 1 bonded by the oxide layer to the second wafer of FIG. 4.
Figure 6:
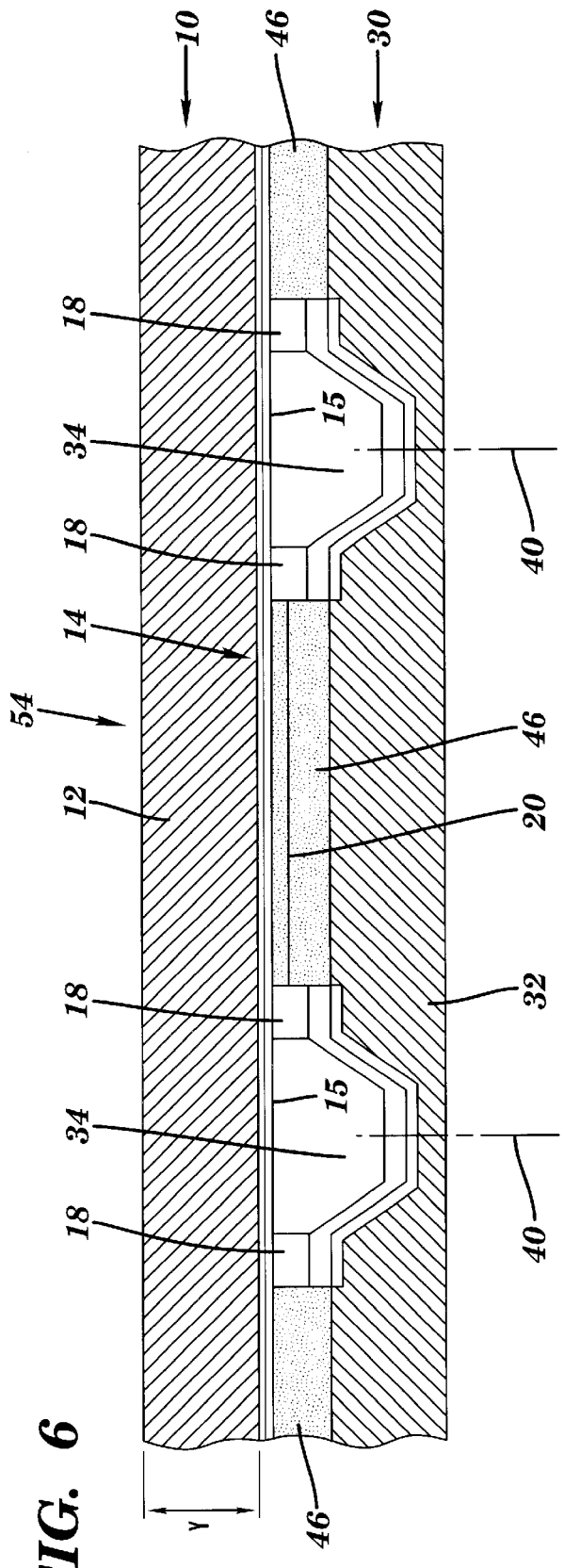
FIG. 6 depicts a wafer composite generally, such as the wafer composite of either FIG. 3 or FIG. 5 with a bonding layer replacing the adhesive layer of FIG. 3 or the oxide layer of FIG. 5.

While FIG. 3 illustrates the first wafer 10 bonded to the second wafer 30 by the adhesive layer 44, the bonding may alternatively be accomplished by any process known to one of ordinary skill in the art. For example, the bonding may be alternatively accomplished by a hydrophilic bonding, namely Step 2 of an Implanted Protons Voids Engineering Process ("IMPROVE process") described in Bruel, M. et al., "'SMART CUT': A Promising New SOI Material Technology," Proc. 1995 IEEE International SOI Conf., October 1955. Under Step 2 of the IMPROVE methodology, hydrophillic bonding of a wafer A to a wafer B occurs at room temperature, wherein wafer B is either bare silicon or an oxide-capped silicon wafer, and wherein wafers A and B are precleaned by a Radio Corporation of America ("RCA") wet clean process. For the present invention, an oxide layer (e.g., a silicon oxide layer) is formed on the second wafer 30 of FIG. 2, resulting in a wafer 31 shown in FIG. 4, with an oxide layer 45 on the substrate 32. Hydrophillic bonding at room temperature of the first wafer 10 (wafer A) of FIG. 1 to the wafer 31 (wafer B) of FIG. 4 results in a composite wafer 52 as shown in FIG. 5. FIG. 5 is the same as FIG. 3, except that the oxide layer 45 in FIG. 5 has replaced the adhesive layer 44 in FIG. 3. FIG. 6 illustrates a wafer composite 54 generally, such as either the wafer composite 50 or 52 of FIG. 3 or FIG. 5, respectively. In FIG. 6, a bonding layer 46 represents the adhesive layer 44 of FIG. 3, the oxide layer 45 of FIG. 5, or any other bonding layer that is known to one of ordinary skill in the art to be effective for the bonding of the first wafer 10 to the second wafer 30. As stated supra in conjunction with FIG. 3, the conductive structure 20 (see FIGS. 5–6) between a pair of the conductive pads 18 is interposed between the CCD layer 14 and the wafer 30.

Figure 7:
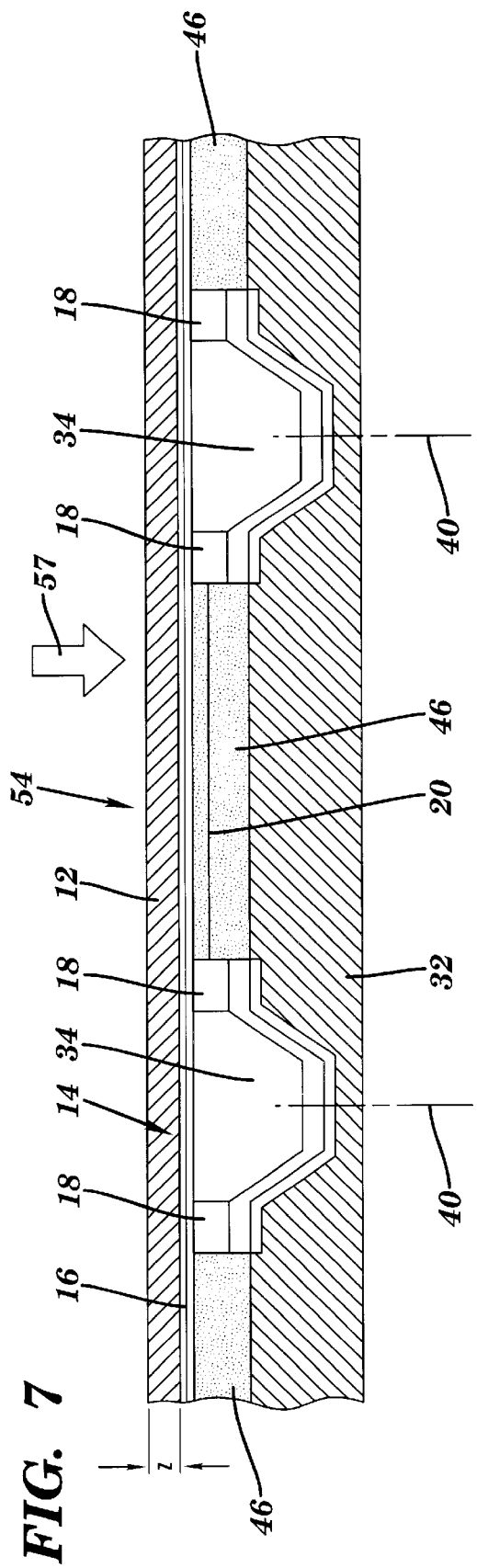
FIG. 7 depicts FIG. 6 after the substrate of the first wafer has been fully or partially removed.

FIG. 7 illustrates FIG. 6 after the substrate 12 of the first wafer 10 has been fully or partially removed, so as to reduce the original thickness Y (see FIG. 1) to a reduced thickness Z wherein $0 \leq Z \leq Y$. by any removal technique that is known to one of ordinary skill in the art such as by grinding or by timed wet etching. At values of Y of the order of hundreds of microns or less, one skilled in the art of etching is capable of controlling the etching of the substrate 12 to within about Z±0.5 microns. The special case of no removal (i.e., Z=Y) is also within the scope of the present invention. A purpose of reducing the thickness of the substrate 12 from Y to Z is to permit electromagnetic radiation, propagating in the direction 57, to reach the CCD layer 14 with sufficient intensity for interacting with the CCD array 16 of the CCD layer 14 to generate a photographic image in the CCD array 16. The maximum permissible value of Z depends on a rate of attenuation of the intensity of the electromagnetic radiation as the electromagnetic radiation traverses the substrate 12. Thus, a maximum permissible value of Z depend upon the wavelength of the electromagnetic radiation and optical transmission or attenuation properties of the material within the substrate 12 in conjunction with said wavelength. For some combinations of wavelength and material within the substrate 12, reducing the thickness of the substrate 12 is unnecessary if the attenuation of the intensity of the electromagnetic radiation is small enough to permit the electromagnetic radiation to generate a photographic image in the CCD array 16, which corresponds to the special case of Z=Y. For simplicity, FIGS. 8–11 (to be discussed infra) do not show the substrate 12, which corresponds to a special case of complete removal of the substrate 12 (i.e., Z=0). Nonetheless, it should be understood that a portion of the substrate 12 may exist (i.e., $0<Z\leq Y$) in conjunction with FIGS. 8–11 provided that the maximum value of Z is in conformity with the aforementioned guideline for Z. If full or partial removal of the substrate 12 generates heat, then it is advantageous for the material of the substrate 12 to have a coefficient of thermal expansion (CTE) that is close (e.g., within 10% differential) to the CTE of the semiconductor material of the substrate 32 in order to prevent or reduce thermal stresses and consequential cracking of portions of the first wafer 10 or the second wafer 30. A manner of achieving the aforementioned CTE relationship is by having a same material within both the substrate 12 and the substrate 32.

The present invention permits the substrate 12 to be reliably removed without damaging the CCD layer 14, because the second wafer 30 provides mechanical support for the CCD layer 14 while the substrate 12 is being removed. Additionally, the process of removing the substrate 12 is efficient, because all of the substrate 12 that is removed is removed in a single operation (or operational sequence) prior to dicing the wafer composite 54 into dies (i.e., the image pick-up device 60 shown in FIG. 9 and described infra), in contrast with a process that would remove the substrate 12 from each die individually after the dies are formed.

FIG. 8 illustrates FIG. 7 after portions of the CCD layer 14 above the blind vias 34 have been removed by any process known to one of ordinary skill in the art such as a wet silicon etch using a mask that is aligned to the blind vias 34. FIG. 9 depicts an image pick-up device 60 that has resulted from dicing the wafer composite 54 of FIG. 8 into image pick-Lip devices. The dicing of the wafer composite 54 into image pick-up devices is implemented by cutting through the total thickness of the wafer composite 54 in the direction 56 along the cut lines 40. The cutting may be implemented by any method known to one of ordinary skill in the art, such as by using a mechanical dicing saw or a laser. Note that removal of portions of the CCD layer 14 depicted in FIG. 8 could be eliminated, and such elimination is within the scope of the present invention. With such elimination, the cutting step in the direction 56, resulting in FIG. 9, would include cutting through the portions of the CCD layer 14 that are about collinear with the cut lines 40, which poses the risk of cracking the CCD layer 14 and creating sharp edges in the CCD layer 14. Thus, even though such elimination of said portions of the CCD layer 14 constitutes an extra processing step, such elimination may nevertheless be desirable since it would eliminate the risk of generating the sharp edges in the CCD layer 14.

Figure 10:
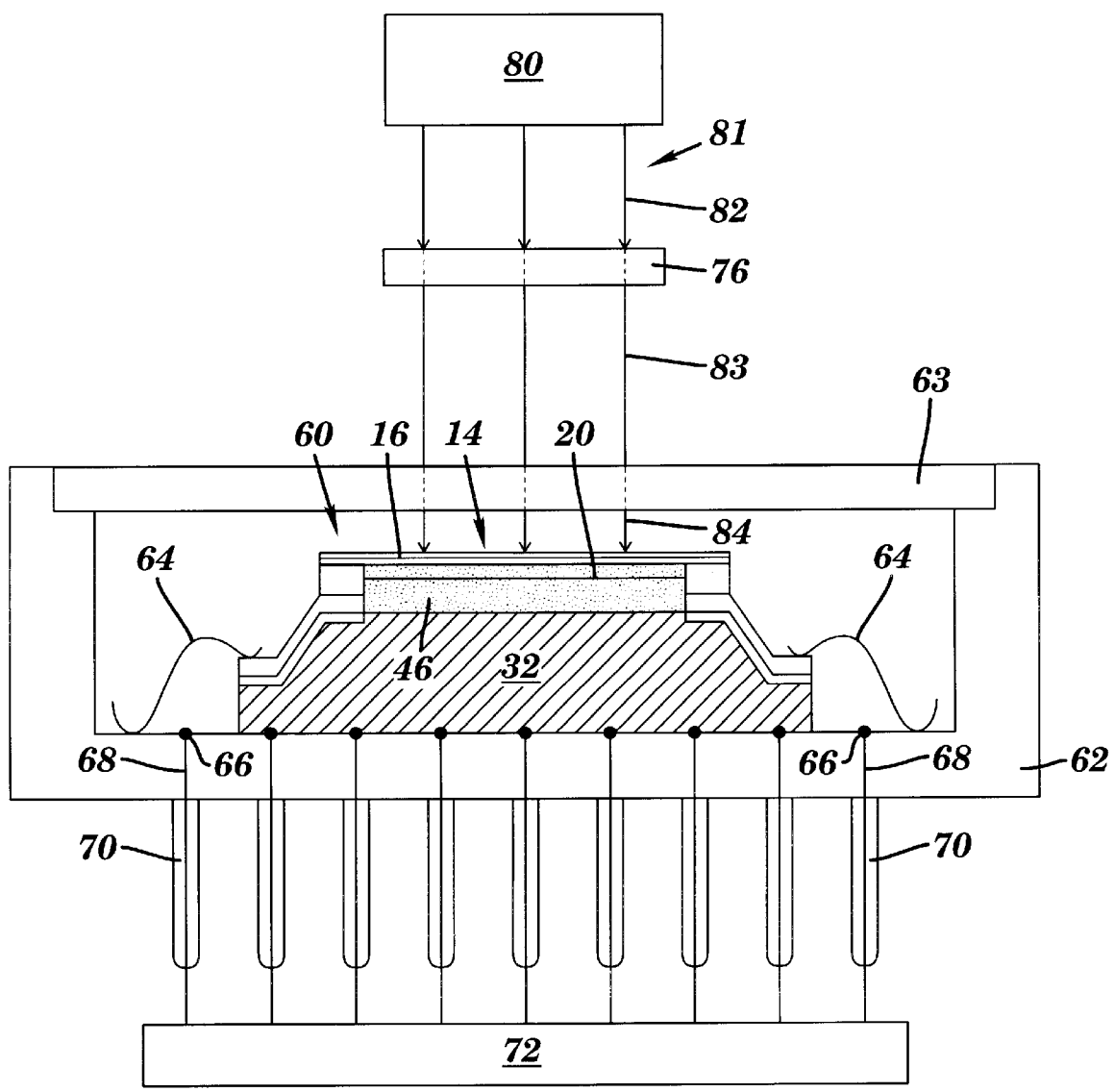
FIG. 10 illustrates the image pick-up device of FIG. 9 coupled to a device carrier and receiving electromagnetic radiation that has passed through an object.

The photosensitive CCD array 16 of the CCD layer 14 enables the image pick-up device 60 to record photoimages of objects. Accordingly, FIG. 10 illustrates the image pick-up device 60 of FIG. 9 receiving electromagnetic radiation 81 that has passed through an object 76. The electromagnetic radiation 81 is emitted by an electromagnetic radiation source 80. A radiation path associated with the electromagnetic radiation 81 includes an emitted radiation 82, an exit radiation 83 (from the object 76), and an incident radiation 84 (unto the CCD layer 14). Note that the exit radiation 83 may pass through a filter 63 interposed between the object 76 and the CCD layer 14. Although FIG. 10, shows a finite gap between the filter 63 and the object 76, the filter 63 may be in direct contact with the object 76. If the CCD array 16 in the CCD layer 14 is photosensitive only in the visible range of the electromagnetic spectrum, and the exit radiation 83 is outside of the visible range (e.g., x-radiation), then the filter 63 may serve to process the exit radiation 83 in a manner that results in radiation leaving the filter 63 (i.e., the incident radiation 84) in the visible range. An example of the filter 63 that would transform x-radiation into visible electromagnetic radiation includes a screen having a phosphorescent material capable of transforming the x-rays into visible light. The photons having a wavelength in the visible portion of the electromagnetic spectrum, after leaving the phosphorescent screen filter 63 and entering the CCD layer 14, are converted by the CCD array 16 into an electronic signature that represents a characteristic of the object 76, such as an image or picture of the object 76 or a distribution of density of the object 76. An alternative to the phosphorescent screen filter 63 for utilizing the exit radiation 83 in the form of x-radiation, the filter 63 may comprise a silicon layer of thickness between about 60 microns and about 500 microns. The x-radiation would interact with the silicon layer and would be absorbed by the silicon layer. The absorbed energy in the silicon layer would be utilized to generate electrons directed into the CCD layer 14. The incident radiation 84 would include the electrons, which would be in a proper energy range for interacting with the CCD array 16 to generate an electronic signature. Note that the aforementioned functionality of the filter 63 as a silicon layer could likewise be accomplished by eliminating the filter 63 and instead retaining the portion of the substrate 12 Such that the substrate 12 includes silicon and has a thickness (Z) between about 60 microns and about 500 microns (see supra discussion of FIG. 7 concerning a reduced thickness Z of the substrate 12).

If the CCD array 16 is photosensitive only in the visible range of the electromagnetic spectrum, and the exit radiation 83 is within the visible range, then the filter 63 may be unnecessary for the purpose of transforming the wavelength of the exit radiation 83. Nonetheless, the filter 63 may serve as a protective cover of the image pick-up device 60 for protecting the image pick-up device 60 against contaminants such as dust regardless of whether the filter 63 transforms the wavelength of the exit radiation 83 in any manner.

As shown in FIG. 10, the image pick-up device 60 may be coupled to a device carrier 62. In particular, the image pick-up device 60 may be electrically coupled to the device carrier 62 by any conductive interface known to one of ordinary skill in the art such as with a wirebond 64 connection or solder ball 66 connections (e.g., controlled collapse chip connection (C4) solder balls). Said conductive interfaces are conductively coupled to the CCD layer 14 by conduction paths (not explicitly shown in FIG. 10) within the substrate 32, such as plated through holes. Additionally, the device carrier 62 may be conductively coupled to an external electronic structure 72, such as a circuit card, by any Known electrically coupling device such as conductive pins 70 or solder balls of a ball grid array (BGA) in place of the conductive pins 70.

Figure 11:
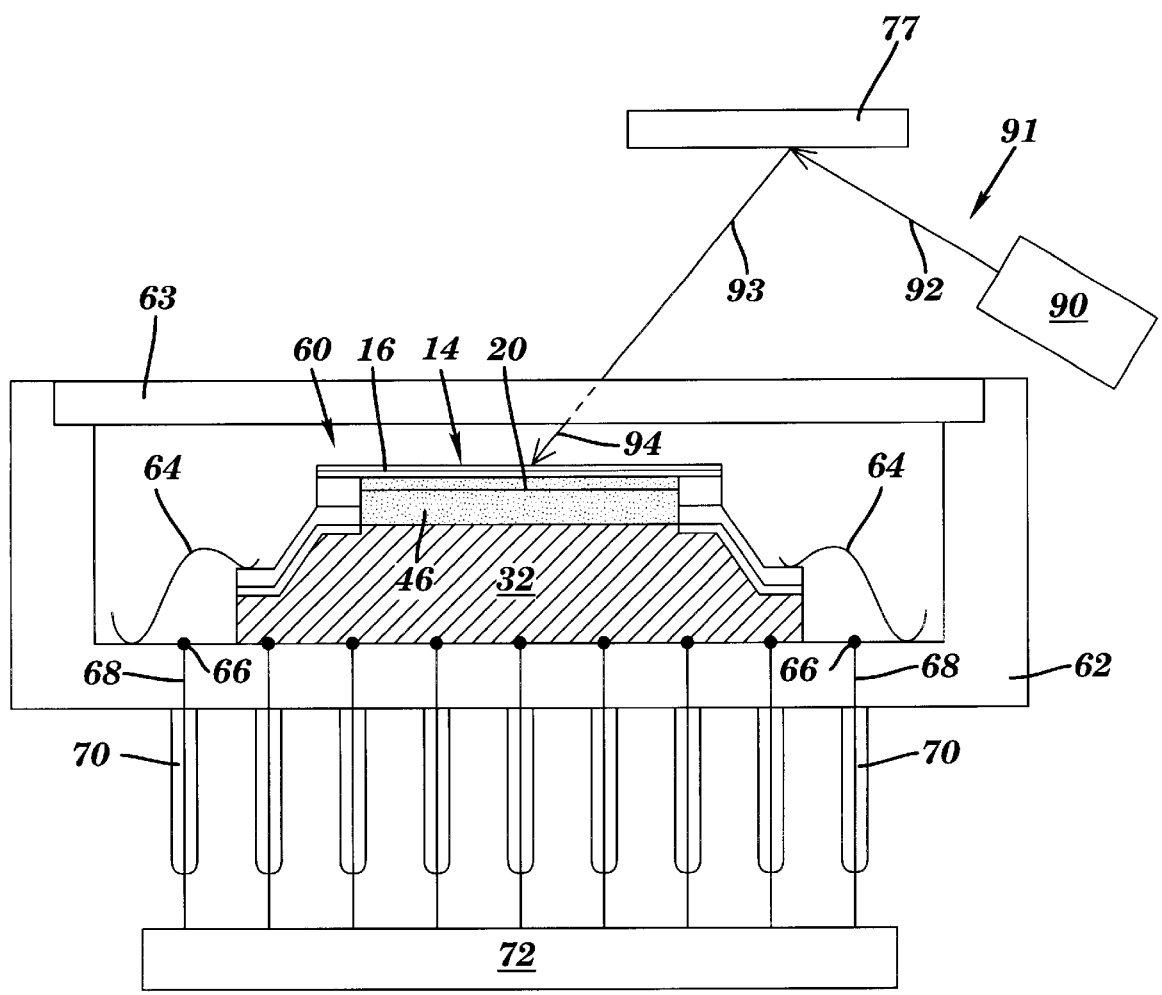
FIG. 11 illustrates the image pick-up device of FIG. 10 coupled to the device carrier and receiving electromagnetic radiation that was reflected from an object.

FIG. 11 illustrates the image pick-up device 60 of FIG. 10 coupled to the device carrier 62 and receiving electromagnetic radiation 91 that was reflected from an object 77. The electromagnetic radiation 91 is emitted by an electromagnetic radiation source 90. A radiation path associated with the electromagnetic radiation 91 includes an emitted radiation 92, an exit radiation 93 (from the object 77), and an incident radiation 94 (unto the CCD layer 14). Note that the exit radiation 83 may pass through the filter 63 interposed between the object 77 and the CCD layer 14. Although FIG. 10, shows a finite gap between the filter 63 and the object 77 the filter 63 may be in direct contact with the object 77. The filter 63 in FIG. 11 has the same functionality that was discussed supra in conjunction with FIG. 10. Additionally, the image pick-up device 60 in FIG. 11 may be coupled to the device carrier 62, and the device carrier 62 may be conductively coupled to the external electronic structure 72, in the same manner that was discussed supra in conjunction with FIG. 10.

While FIG. 10 illustrates the object 76 through which the electromagnetic radiation 81 passes, and FIG. 11 illustrates the object 77 which reflects the electromagnetic radiation 91, it is within the scope of the present invention for electromagnetic radiation to be interacted with by objects in other ways, such as by refracting electromagnetic radiation, by absorbing and reemitting electromagnetic radiation, or by emitting electromagnetic radiation that is internally generated by the object such as when the object is the glowing star (e.g., the sun).

As illustrated in FIGS. 10 and 11, the CCD layer 14 of the image pick-up device 60 may be used in conjunction with the electromagnetic radiation 81 or 91, respectively, to record a characteristic, such as an image or picture, of the object 76 or 77, respectively, or a distribution of density of the object. The image pick-up device 60 may be used in conjunction with a multitude of applications, including in a camera, microscope, or telescope, or for x-raying objects.

While preferred and particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

We claim:

1. A method for forming Charge-Coupled-Device (CCD) image pick-up devices, comprising:
    forming a first wafer having a first substrate, a CCD layer on the first substrate, and first conductive pads arranged in a pattern on a surface of the CCD layer, wherein the CCD layer includes a plurality of CCD image pick-up arrays, and wherein each CCD array of the CCD layer is conductively coupled to a plurality of the first conductive pads;
    providing a second wafer having a second substrate that includes a semiconductor material, and second conductive pads arranged in the pattern on a surface of the second substrate;
    bonding the first wafer with the second wafer to form a wafer composite, wherein the first conductive pads are joined to the second conductive pads in alignment according to the pattern;
    removing a portion of a thickness of the first substrate, after the bonding step, wherein the second wafer provides mechanical support for the CCD layer during said removing; and
    dicing the wafer composite, after the removing step, to form a plurality of the image pickup devices such that each image pick-up device includes a CCD array of the CCD layer.

2. The method of claim 1, wherein a thickness of the CCD layer is at least about 5 microns.

3. The method of claim 1, wherein a thickness of the CCD layer is no greater than about 20 microns.

4. The method of claim 1, wherein a thickness of the first substrate is at least about 300 microns.

5. The method of claim 1, wherein the removing step includes removing an entire thickness of the first substrate.

6. The method of claim 1, wherein the first substrate includes the semiconductor material.

7. The method of claim 6, wherein the semiconductor material includes silicon.

8. The method of claim 1, wherein the first substrate includes a material having a coefficient of thermal expansion (CTE) that differs from the CTE of the semiconductor material by no more than about ten percent.

9. The method of claim 1, wherein the bonding step includes bonding with an adhesive material.

10. The method of claim 1, wherein the step of providing a second wafer further comprises forming a silicon dioxide layer on the surface of the second substrate, and wherein the bonding step is accomplished by a hydrophilic bonding of the first wafer to the silicon dioxide layer of the second wafer, in accordance with an IMPROVE methodology.

11. The method of claim 1, further comprising coupling an image pick-up device of the plurality of image pick-up devices to a device carrier.

12. The method of claim 11, further comprising coupling the device carrier to an electronic structure.

13. The method of claim 12, wherein the electronic structure is a circuit card.

14. The method of claim 1, further comprising:
    exposing an object to electromagnetic radiation resulting in an exit radiation from the object that includes the electromagnetic radiation after having interacted with the object, said having interacted with the object selected from the group consisting of having passed through the object, having been reflected from the object, having been refracted by the object, having been absorbed and re-emitted by the object, and having emitted by the object after having been internally generated by the object;
    exposing the CCD array of the image pick-up device to the exit radiation to form a pattern in the CCD array, said pattern representing a characteristic of the object.

15. The method of claim 14, wherein the characteristic includes a picture of a portion of the object.

16. The method of claim 14, wherein the exit radiation is in a visible portion of the electromagnetic spectrum as the exit radiation leaves the object, and wherein the exit radiation is in the visible portion of the electromagnetic spectrum as the exit radiation is incident upon the CCD array of the image pick-up device.

17. The method of claim 14, wherein the exit radiation is in a non-visible portion of the electromagnetic spectrum as the exit radiation leaves the object, wherein the exit radiation is in a visible portion of the electromagnetic spectrum as the exit radiation is incident upon the CCD array of the image pick-Lip device, and further comprising a filter interposed between the object and the CCD array of the image pick-up device such that the exit radiation passes through the filter and the filter causes the exit radiation to have a wavelength in the visible portion of the electromagnetic spectrum after having passed through the filter.

18. The method of claim 14, wherein the filter comprises silicon, and wherein a thickness of the filter is between about 60 microns and about 500 microns.

19. The method of claim 14, wherein the exit radiation is in a non-visible portion of the electromagnetic spectrum as the exit radiation leaves the object, wherein the exit radiation is in a visible portion of the electromagnetic spectrum as the exit radiation is incident upon the CCD array of the image pick-up device, and wherein the first substrate includes silicon, and wherein a thickness of the first substrate is between about 60 microns and about 500 microns.

20. A method for forming Charge-Coupled-Device (CCD) image pick-up devices, comprising:

forming a first wafer having a first substrate, a CCD layer on the first substrate, and first conductive pads arranged in a pattern on a surface of the CCD layer, wherein the CCD layer includes a plurality of CCD image pick-up arrays, and wherein each CCD array of the CCD layer is conductively coupled to a plurality of the first conductive pads;

providing a second wafer having a second substrate that includes a semiconductor material, and second conductive pads arranged in the pattern on a surface of the second substrate;

bonding the first wafer with the second wafer to form a wafer composite, wherein the first conductive pads are joined to the second conductive pads in alignment according to the pattern; and dicing the wafer composite, after the bonding step, to form a plurality of the image pick-up devices such that each image pick-up device includes a CCD array of the CCD layer.

\* \* \* \* \*